US012658859B2

(12) United States Patent
Tanzil et al.

(10) Patent No.: US 12,658,859 B2
(45) Date of Patent: Jun. 16, 2026

(54) PRACTICAL PREDISTORTION ARCHITECTURES FOR MULTIBAND RADIOS

(71) Applicant: Telefonaktiebolaget LM Ericsson (publ), Stockholm (SE)

(72) Inventors: S M Shahrear Tanzil, Ottawa (CA); Ashim Biswas, Sollentuna (SE); Leonard Rexberg, Hässelby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 341 days.

(21) Appl. No.: 18/279,842

(22) PCT Filed: Mar. 1, 2021

(86) PCT No.: PCT/IB2021/051696
§ 371 (c)(1),
(2) Date: Aug. 31, 2023

(87) PCT Pub. No.: WO2022/185093
PCT Pub. Date: Sep. 9, 2022

(65) Prior Publication Data
US 2024/0063760 A1     Feb. 22, 2024

(51) Int. Cl.
*H03F 1/32* (2006.01)
*H03F 3/24* (2006.01)
(Continued)

(52) U.S. Cl.
CPC ......... *H03F 1/3252* (2013.01); *H04B 1/0053* (2013.01); *H04B 1/0475* (2013.01);
(Continued)

(58) Field of Classification Search
CPC .... H03F 1/3247; H03F 1/3252; H03F 1/3258; H03F 2200/451; H03F 2201/3233;
(Continued)

(56) References Cited

U.S. PATENT DOCUMENTS 8,619,906 B2 * 12/2013 Bai ....................... H03F 1/3294
375/135
8,750,410 B2 6/2014 Gandhi et al.
(Continued)

FOREIGN PATENT DOCUMENTS

WO    2020081887 A1    4/2020
WO    2022071837 A1    4/2022

OTHER PUBLICATIONS

Ding, Lei, et al., "Concurrent Dual-band Digital Predistortion," MTT-S International Microwave Syposium Digest, Jun. 17-22, 2012, Montreal, Canada, IEEE, 3 pages.
(Continued)

*Primary Examiner* — Nguyen T Vo
(74) *Attorney, Agent, or Firm* — Withrow & Terranova, PLLC

(57) ABSTRACT

Systems and methods for separate digital predistortion (S-DPD) for multi-band radios are disclosed. In one embodiment, a method of operation of a digital predistortion (DPD) actuator system for a radio node for a wireless network comprises receiving a plurality of input signals $(x_1, \ldots, x_B)$ for a plurality of frequency bands $(b_1, \ldots, b_B)$, respectively. The method further comprises, for each frequency band $(b_j)$ of the plurality of frequency bands $(b_1, \ldots, b_B)$, generating a plurality of predistorted signals for the frequency band $(b_j)$ based on the plurality of input signals $(x_1, \ldots, x_B)$ and a plurality of Look-Up Tables (LUTs) each having less than B dimensions and combining the plurality of predistorted signals for the frequency band $(b_j)$ to provide a combined predistorted signal for the frequency band $(b_j)$. In this manner, lower dimensionality LUTs are used, which in turn reduces cost and complexity of the DPD system.

16 Claims, 11 Drawing Sheets

(51) Int. Cl.
*H04B 1/00* (2006.01)
*H04B 1/04* (2006.01)

(52) U.S. Cl.
CPC ........ *H03F 3/245* (2013.01); *H03F 2200/451* (2013.01); *H03F 2201/3233* (2013.01); *H04B 2001/0425* (2013.01)

(58) Field of Classification Search
CPC ......... H03F 3/19; H03F 3/245; H04B 1/0053; H04B 1/0475; H04B 2001/0425
See application file for complete search history.

(56) References Cited

U.S. PATENT DOCUMENTS

| | | | |
|---|---|---|---|
| 8,948,301 B2 | 2/2015 | Rollins | |
| 10,644,657 B1 | 5/2020 | Megretski et al. | |
| 2014/0348263 A1* | 11/2014 | Rollins | H03F 3/24 |
| | | | 375/296 |
| 2015/0049841 A1* | 2/2015 | Laporte | H03F 1/3241 |
| | | | 375/297 |

| | | | |
|---|---|---|---|
| 2018/0123617 A1 | 5/2018 | Huang et al. | |
| 2018/0191537 A1 | 7/2018 | Xiong et al. | |
| 2020/0366253 A1 | 11/2020 | Megretski et al. | |

OTHER PUBLICATIONS

Ota, Tomoya, et al., "A Novel Multi-Band Look-Up Table Based Digital Predistorter with a Single Common Feedback Loop," Asia-Pacific Microwave Conference, Nov. 6, 2018, IEICE, pp. 551-553.

Quindroit, Christophe, et al., "FPGA Implementation of Orthogonal 2D Digital Predistortion System for Concurrent Dual-Band Power Amplifiers Based on Time-Division Multiplexing," IEEE Transactions on Microwave Theory and Techniques, vol. 61, Issue 12, Dec. 2013, pp. 4591-4599.

Yu, Chao, et al., "Single-Model Single-Feedback Digital Predistortion for Concurrent Multi-Band Wireless Transmitters," IEEE Transactions on Microwave Theory and Techniques, vol. 63, Issue 7, Jul. 2015, pp. 2211-2224.

International Search Report and Written Opinion for International Patent Application No. PCT/IB2021/051696, mailed Oct. 29, 2021, 17 pages.

* cited by examiner $$z_i(n) = x_i(n) + \sum_{m=0}^{M} x_i(n - Q_m) \sum_{p_1=0}^{P-1} \sum_{p_2=0}^{p_1} \cdots \sum_{p_B=0}^{p_{B-1}} a_{i,m,p_1,p_2,\ldots,p_B} \prod_{b=1}^{B} |x_b(n - Q_m)|^{(p_b - p_{b+1})}$$

$$f_i^{(l)}(n) = x_i(n) + \sum_{m=0}^{M} x_i(n - Q_m)\left(a_{i,m}^{(l)} + \sum_{b=1}^{B}\sum_{p=1}^{P-1} a_{i,m,p,b}^{(l)}|x_b(n - Q_m)|^p\right)$$

$$f_i^{(e)}(n) = \sum_{m=0}^{M} x_i(n - Q_m)\sum_{p=1}^{P-1} a_{i,m,p}^{(e)}\left(\sum_{b=1}^{B}|x_b(n - Q_m)|\right)^p$$

902-I

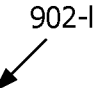

```
┌ ─ ─ ─ ─ ─ ─ ─ ─ ─ ─ ─ ─ ─ ─ ─ ─ ─ ─ ─ ─ ┐
│   GENERATE A PREDISTORTED SIGNAL FOR FREQUENCY BAND bₗ   │
│   IN A MANNER THAT TAKES INTO CONSIDERATION A SINGLE    │
│   FREQUENCY BAND AT A TIME USING A ONE-DIMENSIONAL LUT   │
│                          1000                           │
└ ─ ─ ─ ─ ─ ─ ─ ─ ─ ─ ─ ─ ─ ─ ─ ─ ─ ─ ─ ─ ┘
```

GENERATE A PREDISTORTED SIGNAL FOR FREQUENCY BAND $b_l$ IN A MANNER THAT TAKES INTO CONSIDERATION A SINGLE FREQUENCY BAND AT A TIME USING A ONE-DIMENSIONAL LUT
1000

FOR EACH VALUE OF r FROM AT LEAST A SUBSET OF A SET OF VALUES {q, q+1, ..., B-2}, GENERATE A PREDISTORTED SIGNAL FOR FREQUENCY BAND $b_l$ FOR THE VALUE OF r (I.E., B-r FREQUENCY BANDS) BASED ON: (A) THE INPUT SIGNALS FOR A SET OF FREQUENCY BAND COMBINATIONS CONSISTING OF AT LEAST ONE, AT LEAST TWO, OR ALL COMBINATIONS OF B-r FREQUENCY BANDS AND (B) A SET OF LUTs THAT INCLUDES A (B-r) DIMENSIONAL LUT FOR EACH FREQUENCY BAND COMBINATION IN THE SET OF FREQUENCY BAND COMBINATIONS
1002

GENERATE A PREDISTORTED SIGNAL FOR FREQUENCY BAND $b_l$ BASED ON MAGNITUDES OF THE INPUT SIGNALS FOR FREQUENCY BANDS ($b_1$, ..., $b_B$) AND A ONE-DIMENSIONAL LUT
1004

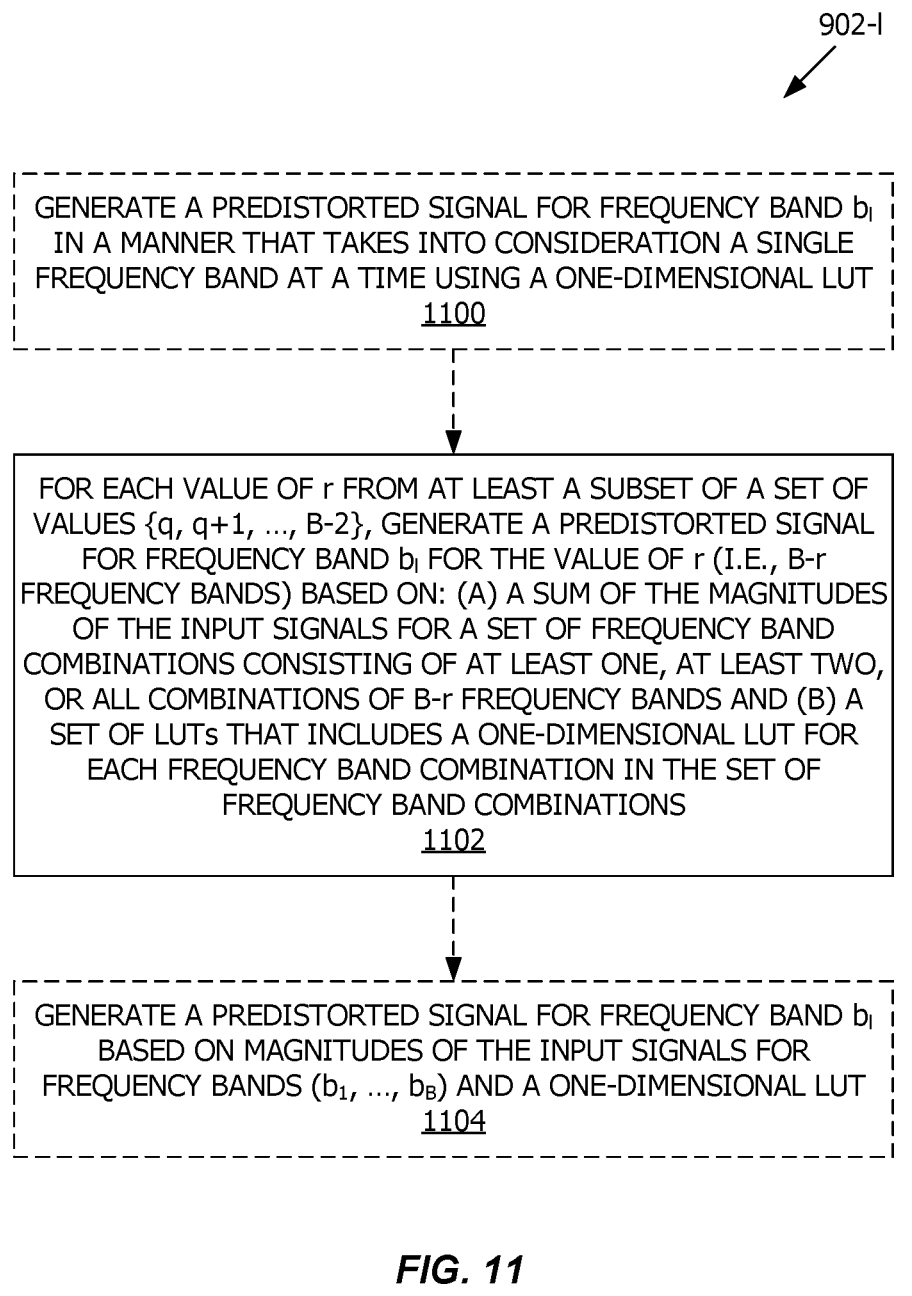

GENERATE A PREDISTORTED SIGNAL FOR FREQUENCY BAND $b_l$
IN A MANNER THAT TAKES INTO CONSIDERATION A SINGLE
FREQUENCY BAND AT A TIME USING A ONE-DIMENSIONAL LUT
1100

FOR EACH VALUE OF r FROM AT LEAST A SUBSET OF A SET OF
VALUES {q, q+1, ..., B-2}, GENERATE A PREDISTORTED SIGNAL
FOR FREQUENCY BAND $b_l$ FOR THE VALUE OF r (I.E., B-r
FREQUENCY BANDS) BASED ON: (A) A SUM OF THE MAGNITUDES
OF THE INPUT SIGNALS FOR A SET OF FREQUENCY BAND
COMBINATIONS CONSISTING OF AT LEAST ONE, AT LEAST TWO,
OR ALL COMBINATIONS OF B-r FREQUENCY BANDS AND (B) A
SET OF LUTs THAT INCLUDES A ONE-DIMENSIONAL LUT FOR
EACH FREQUENCY BAND COMBINATION IN THE SET OF
FREQUENCY BAND COMBINATIONS
1102

GENERATE A PREDISTORTED SIGNAL FOR FREQUENCY BAND $b_l$
BASED ON MAGNITUDES OF THE INPUT SIGNALS FOR
FREQUENCY BANDS ($b_1$, ..., $b_B$) AND A ONE-DIMENSIONAL LUT
1104

FIG. 11

PRACTICAL PREDISTORTION ARCHITECTURES FOR MULTIBAND RADIOS

This application is a 35 U.S.C. § 371 national phase filing of International Application No. PCT/IB2021/051696, filed Mar. 1, 2021, the disclosure of which is incorporated herein by reference in its entirety.

TECHNICAL FIELD

The present disclosure relates to digital predistortion (DPD) for multiband radios.

BACKGROUND

For a wideband High-Power Amplifier (HPA) with Instantaneous Bandwidth (IBW) of, e.g., 1 Gigahertz (GHz) or above, it has been observed that traditional Lookup Table (LUT) based methods for linearization are excessively costly because of higher sample rate requirements. It has been observed that Peven with higher sample rates, LUT based methods for linearization are unable to reach the desired Adjacent Channel Leakage Ratio (ACLR) performance. Separate Digital Predistortion (S-DPD), which is also known as frequency selective Digital Predistortion (DPD), treats each linearization region separately. S-DPD not only offers low sample rate operations but also can reach desired ACLR performance levels. One example of S-DPD is described in U.S. Pat. No. 8,750,410 B2 (hereinafter referred to as "the '410 Patent").

The basic idea of S-DPD is to formulate a multivariate Generalized Memory Polynomial (GMP) or just Memory Polynomial (MP) for each linearization region and estimate corresponding coefficients independently. Typically, each linearization region covers a transmission frequency band. As such, the terms linearization region and frequency band are used interchangeably herein. After estimating the coefficients for the linearization regions, a portion of each of the S-DPD polynomials can be quantized to a multidimensional LUT. This is usually done by forming either a uniform or non-uniform multidimensional grid of points over the range of inputs, followed by evaluation of the S-DPD polynomials at the grid points. These evaluated points are stored as LUT outputs for each combination of inputs. Using the multidimensional LUT for the S-DPD actuator (or DPD forward calculation) makes it much faster and economical compared to evaluating the polynomial. This approach is known as hybrid LUTs and has proven a cost-effective solution for multiband implementation (see, e.g., Christophe Quindroit, Naveen Naraharisetti, Patrick Roblin, Shahin Gheitanchi, Volker Mauer, Mike Fitton, "FPGA Implementation of Orthogonal 2D Digital Predistortion System for Concurrent Dual-Band Power Amplifiers Based on Time-Division Multiplexing", IEEE TRANSACTIONS ON MICROWAVE THEORY AND TECHNIQUES, VOL. 61, NO. 12, December 2013, p. 4591-4599, which is hereinafter referred to as the "Quindroit Paper"). For instance, a triple band system will have a 3-dimensional hybrid LUT for each of its bands.

The main drawback of S-DPD for linearization is scalability in terms of computational complexity. Dual-band systems are still manageable, and triple-band systems can be built by coalescing two bands into one if they are near in frequency and essentially treating the triple-band system as dual-band system. However, this band reduction fails if the combined bands are not near and for systems with more than three frequency bands. Evaluation of very a high order polynomial soon becomes equally expensive as traditional LUT methods with more than two bands. In addition, though a multidimensional LUT provides a very fast computational alternative to evaluate a polynomial, the memory requirements soon become unmanageable from three frequency bands onwards.

In this regard, the '410 Patent discloses a multi-band power amplifier digital predistortion system that uses a S-DPD architecture. However, this multiband power amplifier digital predistortion system uses the product of two band inputs (see Equations 4-6 of the '410 Patent). As a result, this multiband power amplifier digital predistortion system requires B-dimensional LUTs to support B frequency bands. Again, while such multidimensional LUTs provide a very fast computational alternative to evaluate a polynomial, the memory requirements soon become unmanageable as B increases beyond 2.

U.S. Pat. No. 8,948,301 B2 (hereinafter referred to as "the '301 Patent") discloses a DPD system that works on radio frequency (RF) signals and, as such, requires a high sampling rate. Further, this DPD system also requires B-dimensional LUTs to support B frequency bands, which may result in unmanageable memory requirements as B increases beyond 2.

SUMMARY

Systems and methods for reduced dimensionality separate digital predistortion (S-DPD) for multi-band radios are disclosed. In one embodiment, a method of operation of a digital predistortion (DPD) actuator system for a radio node for a wireless network comprises receiving a plurality of input signals $(x_1, \ldots, x_B)$ for a plurality of frequency bands $(b_1, \ldots, b_B)$, respectively. The method further comprises, for each frequency band $(b_i)$ of the plurality of frequency bands $(b_1, \ldots, b_B)$, generating a plurality of predistorted signals for the frequency band $(b_i)$ based on the plurality of input signals $(x_1, \ldots, x_B)$ and a plurality of Look-Up Tables (LUTs) each having less than B dimensions and combining the plurality of predistorted signals for the frequency band $(b_i)$ to provide a combined predistorted signal for the frequency band $(b_i)$. In this manner, lower dimensionality LUTs are used as compared to traditional S-DPD, which in turn reduces cost and complexity of the DPD system.

In one embodiment, for each frequency band $(b_i)$ of the plurality of frequency bands $(b_1, \ldots, b_B)$, generating the plurality of predistorted signals for the frequency band $(b_i)$ comprises, for each value of r from at least a subset of a set of values $\{q, q+1, \ldots, B-2\}$ where $1 \le q \le B-2$, generating a predistorted input signal for the frequency band $(b_i)$ for the value of r, based on: (a) input signals for a set of frequency band combinations that consists of at least one combination of B-r frequency bands from among the plurality of frequency bands $(b_1, \ldots, b_B)$ and (b) a set of LUTs that comprises a B-r dimension LUT for each frequency band combination in the set of frequency band combinations.

In one embodiment, for each frequency band $(b_i)$ of the plurality of frequency bands $(b_1, \ldots, b_B)$, generating the plurality of predistorted signals for the frequency band $(b_i)$ comprises, for each value of r from at least a subset of a set of values $\{q, q+1, \ldots, B-2\}$ where $1 \le q \le B-2$, generating a predistorted input signal for the frequency band $(b_i)$ for the value of r, based on: (a) input signals for a set of frequency band combinations that consists of at least two combinations of B-r frequency bands from among the plurality of frequency bands $(b_1, \ldots, b_B)$ and (b) a set of LUTs that comprises a B−r dimension LUT for each frequency band combination in the set of frequency band combinations.

In one embodiment, for each frequency band ($b_j$) of the plurality of frequency bands ($b_1$, . . . , $b_B$), generating the plurality of predistorted signals for the frequency band ($b_j$) comprises, for each value of r from at least a subset of a set of values $\{q, q+1, . . . , B-2\}$ where $1 \leq q \leq B-2$, generating (1002) a predistorted input signal for the frequency band ($b_j$) for the value of r, based on: (a) input signals for a set of frequency band combinations that consists of all combinations of B−r frequency bands from among the plurality of frequency bands ($b_1$, . . . , $b_B$) and (b) a set of LUTs that comprises a B−r dimension LUT for each frequency band combination in the set of frequency band combinations.

In one embodiment, for each frequency band ($b_j$) of the plurality of frequency bands ($b_1$, . . . , $b_B$), generating the plurality of predistorted signals for the frequency band ($b_j$) comprises, for each value of r from at least a subset of a set of values $\{q, q+1, . . . , B-2\}$ where $1 \leq q \leq B-2$, generating a predistorted input signal for the frequency band ($b_j$) for the value of r, based on: (a) a sum of magnitudes of input signals for a set of frequency band combinations that consists of at least one combination of B−r frequency bands from among the plurality of frequency bands ($b_1$, . . . , $b_B$) and (b) a set of LUTs that comprises a single-dimension LUT for each frequency band combination in the set of frequency band combinations.

In one embodiment, for each frequency band ($b_j$) of the plurality of frequency bands ($b_1$, . . . , $b_B$), generating the plurality of predistorted signals for the frequency band ($b_j$) comprises, for each value of r from at least a subset of a set of values $\{q, q+1, . . . , B-2\}$ where $1 \leq q \leq B-2$, generating a predistorted input signal for the frequency band ($b_j$) for the value of r, based on: (a) a sum of magnitudes of input signals for a set of frequency band combinations that consists of at least two combinations of B−r frequency bands from among the plurality of frequency bands ($b_1$, . . . , $b_B$) and (b) a set of LUTs that comprises a single-dimension LUT for each frequency band combination in the set of frequency band combinations.

In one embodiment, for each frequency band ($b_j$) of the plurality of frequency bands ($b_1$, . . . , $b_B$), generating the plurality of predistorted signals for the frequency band ($b_j$) comprises, for each value of r from at least a subset of a set of values $\{q, q+1, . . . , B-2\}$ where $1 \leq q \leq B-2$, generating a predistorted input signal for the frequency band ($b_j$) for the value of r, based on: (a) a sum of magnitudes of input signals for a set of frequency band combinations that consists of all combinations of B−r frequency bands from among the plurality of frequency bands ($b_1$, . . . , $b_B$) and (b) a set of LUTs that comprises a single-dimension LUT for each frequency band combination in the set of frequency band combinations.

In one embodiment, for each frequency band ($b_j$) of the plurality of frequency bands ($b_1$, . . . , $b_B$), the at least a subset of the set of values $\{q, q+1, . . . , B-2\}$ consists of at least one value from the set of values $\{q, q+1, . . . , B-2\}$. In another embodiment, for at least one frequency band ($b_j$) of the plurality of frequency bands ($b_1$, . . . , $b_B$), the at least a subset of the set of values $\{q, q+1, . . . , B-2\}$ consists of at least two values from the set of values $\{q, q+1, . . . , B-2\}$. In another embodiment, for at least one frequency band ($b_j$) of the plurality of frequency bands ($b_1$, . . . , $b_B$), the at least a subset of the set of values $\{q, q+1, . . . , B-2\}$ consists of all values from the set of values $\{q, q+1, . . . , B-2\}$.

In one embodiment, the at least a subset of the set of values $\{q, q+1, . . . , B-2\}$ is different for at least two of the plurality of frequency bands ($b_1$, . . . , $b_B$). In another embodiment, the at least a subset of the set of values $\{q, q+1, . . . , B-2\}$ is the same for all of the plurality of frequency bands ($b_1$, . . . , $b_B$).

In one embodiment, for at least one frequency band ($b_j$) of the plurality of frequency bands ($b_1$, . . . , $b_B$), generating the plurality of predistorted signals for the frequency band ($b_j$) further comprises generating a predistorted signal for the frequency band ($b_j$) in a manner that takes into account only a single frequency band at a time.

In one embodiment, for at least one frequency band ($b_j$) of the plurality of frequency bands ($b_1$, . . . , $b_B$), generating the plurality of predistorted signals for the frequency band ($b_j$) further comprises generating a predistorted signal for the frequency band ($b_j$) based on a summation of magnitudes of the plurality of input signals ($x_1$, . . . , $x_B$) for the plurality of frequency bands ($b_1$, . . . , $b_B$) and a single-dimension LUT for the frequency band ($b_j$).

Corresponding embodiments of a DPD actuator system for a radio node for a wireless network comprises a plurality of S-DPD actuators for a plurality of frequency bands ($b_1$, . . . , $b_B$), respectively. Each S-DPD actuator of the plurality of S-DPD actuators is configured to: receive a plurality of input signals ($x_1$, . . . , $x_B$) for the plurality of frequency bands ($b_1$, . . . , $b_B$), respectively; generate a plurality of predistorted signals for a frequency band ($b_j$) of the plurality of frequency bands ($b_1$, . . . , $b_B$) based on the plurality of input signals ($x_1$, . . . , $x_B$) and a plurality of LUTs each having less than B dimensions; and combine the plurality of predistorted signals for the frequency band ($b_j$) to provide a combined predistorted signal for the frequency band ($b_j$).

In one embodiment, each S-DPD actuator of the plurality of S-DPD actuators comprises, for each value of r from at least a subset of a set of values $\{q, q+1, . . . , B-2\}$ where $1 \leq q \leq B-2$, a sub-DPD actuator configured to generate a predistorted input signal for the frequency band ($b_j$) for the value of r, based on: (a) input signals for a set of frequency band combinations that consists of at least one combination of B−r frequency bands from among the plurality of frequency bands ($b_1$, . . . , $b_B$) and (b) a set of LUTs that comprises a B−r dimension LUT for each frequency band combination in the set of frequency band combinations.

In one embodiment, each S-DPD actuator of the plurality of S-DPD actuators comprises, for each value of r from at least a subset of a set of values $\{q, q+1, . . . , B-2\}$ where $1 \leq q \leq B-2$, a sub-DPD actuator configured to generate a predistorted input signal for the frequency band ($b_j$) for the value of r, based on: (a) input signals for a set of frequency band combinations that consists of at least two combinations of B−r frequency bands from among the plurality of frequency bands ($b_1$, . . . , $b_B$) and (b) a set of LUTs that comprises a B−r dimension LUT for each frequency band combination in the set of frequency band combinations.

In one embodiment, each S-DPD actuator of the plurality of S-DPD actuators comprises, for each value of r from at least a subset of a set of values $\{q, q+1, . . . , B-2\}$ where $1 \leq q \leq B-2$, a sub-DPD actuator configured to generate a predistorted input signal for the frequency band ($b_j$) for the value of r, based on: (a) input signals for a set of frequency band combinations that consists of all combinations of B−r frequency bands from among the plurality of frequency bands ($b_1$, . . . , $b_B$) and a set of LUTs that comprises a B−r dimension LUT for each frequency band combination in the set of frequency band combinations.

In one embodiment, each S-DPD actuator of the plurality of S-DPD actuators comprises, for each value of r from at least a subset of a set of values $\{q, q+1, . . . , B-2\}$ where $1 \leq q \leq B-2$, a sub-DPD actuator configured to generate a predistorted input signal for the frequency band ($b_l$) for the value of r, based on: (a) a sum of magnitudes of input signals for a set of frequency band combinations that consists of at least one combination of B–r frequency bands from among the plurality of frequency bands ($b_1$, . . . , $b_B$) and a set of LUTs that comprises a single-dimension LUT for each frequency band combination in the set of frequency band combinations.

In one embodiment, each S-DPD actuator of the plurality of S-DPD actuators comprises, for each value of r from at least a subset of a set of values {q, q+1, . . . , B–2} where $1 \leq q \leq B-2$, a sub-DPD actuator configured to generate a predistorted input signal for the frequency band ($b_l$) for the value of r, based on: (a) a sum of magnitudes of input signals for a set of frequency band combinations that consists of at least two combinations of B–r frequency bands from among the plurality of frequency bands ($b_1$, . . . , $b_B$) and a set of LUTs that comprises a single-dimension LUT for each frequency band combination in the set of frequency band combinations.

In one embodiment, each S-DPD actuator of the plurality of S-DPD actuators comprises, for each value of r from at least a subset of a set of values {q, q+1, . . . , B–2} where $1 \leq q \leq B-2$, a sub-DPD actuator configured to generate a predistorted input signal for the frequency band ($b_l$) for the value of r, based on: (a) a sum of magnitudes of input signals for a set of frequency band combinations that consists of all combinations of B–r frequency bands from among the plurality of frequency bands ($b_1$, . . . , $b_B$) and a set of LUTs that comprises a single-dimension LUT for each frequency band combination in the set of frequency band combinations.

In one embodiment, for each S-DPD actuator of the plurality of S-DPD actuators, the at least a subset of the set of values {q, q+1, . . . , B–2} consists of at least one value from the set of values {q, q+1, . . . , B–2}. In another embodiment, for each S-DPD actuator of the plurality of S-DPD actuators, the at least a subset of the set of values {q, q+1, . . . , B–2} consists of at least two values from the set of values {q, q+1, . . . , B–2}. In another embodiment, for each S-DPD actuator of the plurality of S-DPD actuators, the at least a subset of the set of values {q, q+1, . . . , B–2} consists of all values from the set of values {q, q+1, . . . , B–2}.

In one embodiment, the at least a subset of the set of values {q, q+1, . . . , B–2} is different for at least two of the plurality of frequency bands ($b_1$, . . . , $b_B$). In another embodiment, the at least a subset of the set of values {q, q+1, . . . , B–2} is the same for all of the plurality of frequency bands ($b_1$, . . . , $b_B$).

In one embodiment, for at least one S-DPD actuator of the plurality of S-DPD actuators, the at least one S-DPD actuator further comprises a sub-DPD actuator configured to generate a predistorted signal for the frequency band ($b_l$) in a manner that takes into account only a single frequency band at a time.

In one embodiment, for at least one S-DPD actuator of the plurality of S-DPD actuators, the at least one S-DPD actuator further comprises a sub-DPD actuator configured to generate a predistorted signal for the frequency band ($b_l$) based on a summation of magnitudes of the plurality of input signals for the plurality of frequency bands ($b_1$, . . . , $b_B$) and a single-dimension LUT for the frequency band ($b_l$).

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 10 is a flow chart that illustrates details of step 902-$l$ for the l-th frequency band ($b_l$) in accordance with one embodiment of the (B–q) dimensional S-DPD scheme described herein; and FIG. 11 is a flow chart that illustrates details of step 902-$l$ for the l-th frequency band ($b_l$) in accordance with one embodiment of the one-dimensional S-DPD scheme described above.

DETAILED DESCRIPTION

Figure 1:
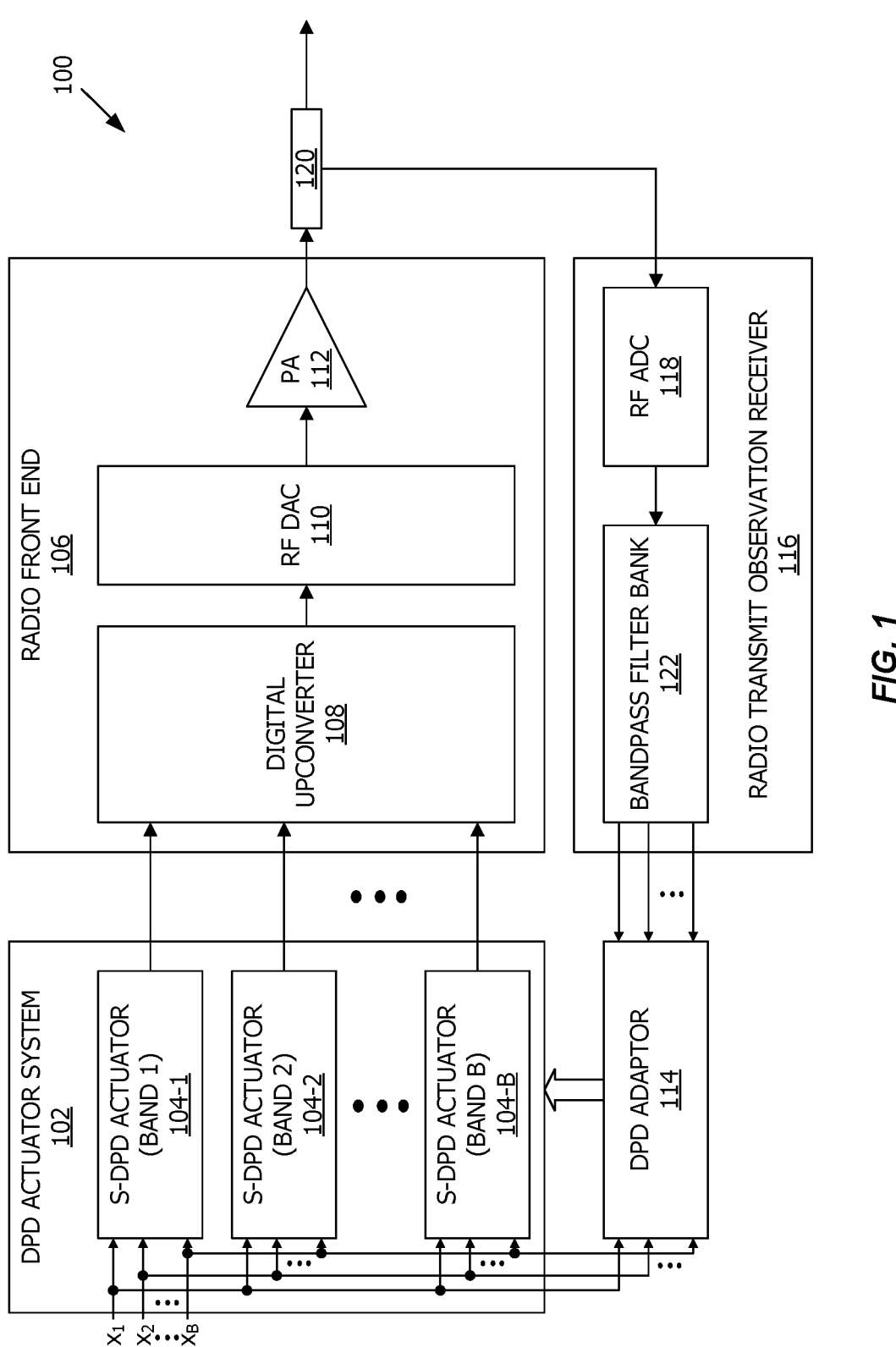
FIG. 1 illustrates a radio node that includes a Digital Predistortion (DPD) system that uses a traditional Separate DPD (S-DPD) architecture.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless communication device.

Radio Access Node: As used herein, a "radio access node" or "radio network node" or "radio access network node" is any node in a Radio Access Network (RAN) of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) Fifth Generation (5G) NR network or an enhanced or evolved Node B (eNB) in a 3GPP Long Term Evolution (LTE) network), a high-power or macro base station, a low-power base station (e.g., a micro base station, a pico base station, a home eNB, or the like), a relay node, a network node that implements part of the functionality of a base station or a network node that implements a gNB Distributed Unit (gNB-DU)) or a network node that implements part of the functionality of some other type of radio access node.

Communication Device: As used herein, a "communication device" is any type of device that has access to an access network. Some examples of a communication device include, but are not limited to: mobile phone, smart phone, sensor device, meter, vehicle, household appliance, medical appliance, media player, camera, or any type of consumer electronic, for instance, but not limited to, a television, radio, lighting arrangement, tablet computer, laptop, or Personal Computer (PC). The communication device may be a portable, hand-held, computer-comprised, or vehicle-mounted mobile device, enabled to communicate voice and/or data via a wireless or wireline connection.

Wireless Communication Device: One type of communication device is a wireless communication device, which may be any type of wireless device that has access to (i.e., is served by) a wireless network (e.g., a cellular network). Some examples of a wireless communication device include, but are not limited to: a User Equipment device (UE) in a 3GPP network, a Machine Type Communication (MTC) device, and an Internet of Things (IoT) device. Such wireless communication devices may be, or may be integrated into, a mobile phone, smart phone, sensor device, meter, vehicle, household appliance, medical appliance, media player, camera, or any type of consumer electronic, for instance, but not limited to, a television, radio, lighting arrangement, tablet computer, laptop, or PC. The wireless communication device may be a portable, hand-held, computer-comprised, or vehicle-mounted mobile device, enabled to communicate voice and/or data via a wireless connection.

Systems and methods are disclosed herein that provide an effective Separate Digital Predistortion (S-DPD) architecture for a multiband system. Embodiments of the present disclosure provide a S-DPD system that utilizes reduced dimensionality hybrid Lookup Tables (LUT). In one embodiment, a S-DPD system is provided that uses B−q dimensional hybrid LUTs, where q={1, 2, . . . , B−2}. In another embodiment, a S-DPD system is provided that uses one-dimensional hybrid LUTs. In both embodiments, a summation over several lower dimension hybrid LUTs it utilized to provide the desired predistorted signal. Depending on the desired performance of linearization and available resources, one can choose between two options with lower dimensions by using the proposed architectures. The main advantage of lower dimensionality LUTs is cost and power.

Before describing embodiments of the present disclosure, it is beneficial to first describe a traditional S-DPD. In this regard, FIG. 1 illustrates a radio node 100 that includes a DPD system 102 that uses a traditional S-DPD architecture. As illustrated, the DPD system 102 includes multiple S-DPD actuators 104-1 through 104-B for B respective frequency bands ($b_1$, . . . , $b_B$), where B is greater than or equal to 2. As discussed below in detail, each S-DPD actuator 104-$l$ (for the l-th frequency band) receives input signals ($x_1$, . . . , $x_B$) (i.e., complex baseband input signals) for the B frequency bands and generates a predistorted signal for the l-th frequency band based on the received input signals ($x_1$, . . . , $x_B$) and a S-DPD actuator mechanism (e.g., memory polynomial or LUT scheme). In this example, the predistorted signals for the B frequency bands are processed by a radio unit 106 of the radio unit 100 to provide a radio frequency (RF) signal for transmission. Specifically, in this example, the predistorted signals for the B frequency bands a digitally upconverted by a digital upconverter 108, converted to analog by an RF digital-to-analog converter (DAC) 110, and amplified by a power amplifier (PA) 112.

As will be appreciated by those of skill in the art, the S-DPD actuators 104-1 through 104-B are trained by a DPD adaptor 114 based on the input signals ($x_1$, . . . , $x_B$) and feedback signals for the B frequency bands received via a radio transmit observation receiver (TOR) 116. In this example, the TOR 116 includes a RF analog-to-digital converter (ADC) 118 coupled to an output of the PA 112 via a coupler 120 and a bandpass filter bank 122 that filters the output of the RF ADC 118 to provide the feedback signals (i.e., complex baseband feedback signals) for the B frequency bands. Note that both the radio front end 106 and the TOR 116 may include additional or alternative component that are not illustrated in FIG. 1, as will be appreciated by those of ordinary skill in the art.

The operation of the S-DPD actuators 104-1 through 104-B is described below in terms of a memory polynomial (MP); however, one can easily extend the formulation for different variants of Volterra series such as a Generalized Memory Polynomial (GMP). Let us use $x_l(n)$ to represent input signals (i.e., input samples), where l∈ (1, B) represents the frequency band index. The output signal (i.e., output samples) from the l-th S-DPD 104-$l$ is denoted by $z_l(n)$. Note that n refers to a time-index. The maximum non-linear order of the S-DPD 104-$l$ is denoted by P. Memory taps are denoted by the set $Q=\{Q_0, Q_1, Q_2, . . . Q_M\}$ with $Q_0$=0. The cardinality of $Q$ is M+1.

The output from the S-DPD actuator 104-$l$ can be written as in Equation (1).

$$z_l(n) = x_l(n) + \sum_{m=0}^{M} x_l(n -$$ (1)

$$Q_m) \sum_{p_1=0}^{P-1} \sum_{p_2=0}^{p_1} \cdots \sum_{p_B=0}^{p_{B-1}} \alpha_{l,m,p_1,p_2,...,p_B} \prod_{b=1}^{B} |x_b(n - Q_m)|^{(p_b - p_{b+1})}$$

Here, $\alpha_{l,m,p_1,p_2, . . . , p_B}$ refers to the S-DPD coefficients and $p_1$=(0,(P−1)), with the restriction $p_{b+1}\in (0, p_b)$ and $p_{B+1}$=0. Equation (1) captures that the non-linear modelling of the inverse of the PA 112 (i.e., the predistortion) can be performed by considering the current and past samples. Past samples are included because of memory effects inherent in electronic devices. The nonlinearity of the PA 112 creates intermodulation frequencies and that is modelled by the B multiplicative terms and exponents $p_b$ in Equation (1). When memory and non-linearities are both absent, Equation (1) becomes simpler i.e., $z_l(n)=x_l(n)$. Please note that there are B S-DPD actuators 104-1 through 104-B, and the description of the l-th S-DPD actuator 104-$l$ is applicable of the S-DPD actuators 104-1 through 104-B.

As known to those of ordinary skill in the art, the DPD adaptor 114 can use the least square or other adaptive methods to identify S-DPD coefficients. In the S-DPD actuators 104-1 through 104-B, one can use either polynomial based approach as in the Equation (1) or use variants of a LUT based approach as described below.

Figure 2:
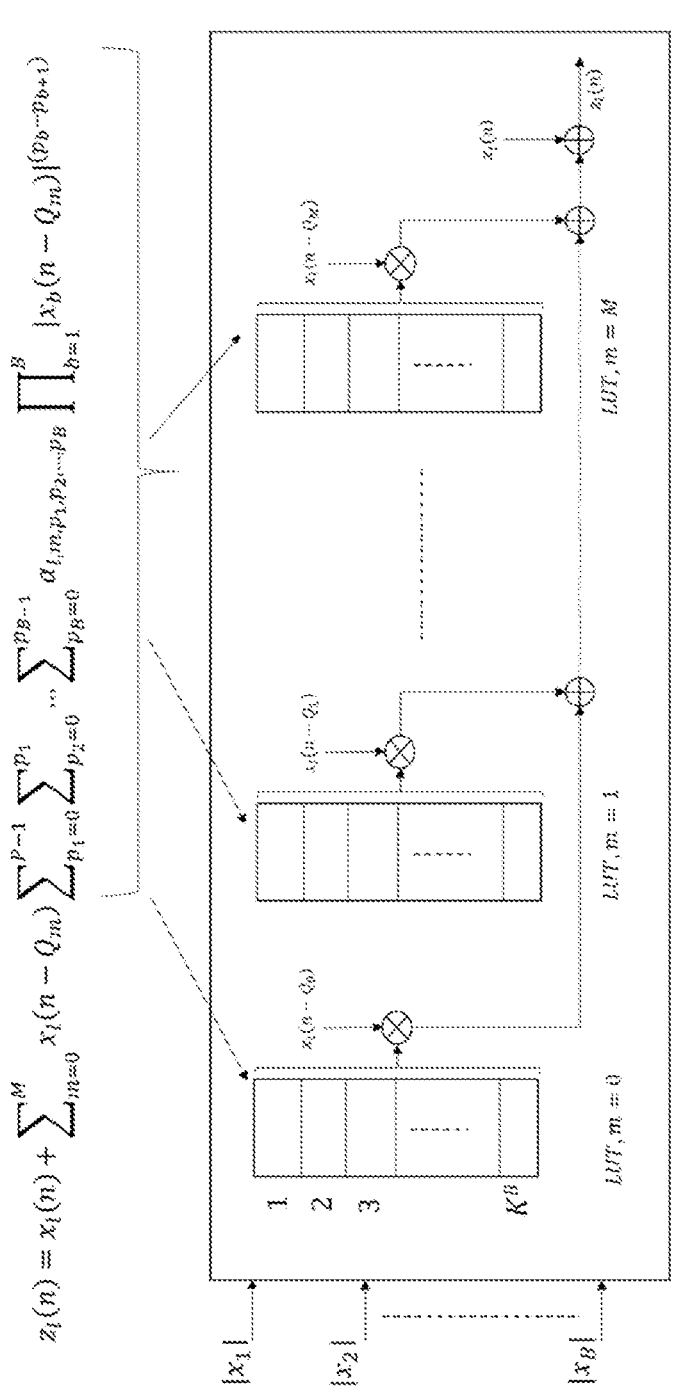
FIG. 2 illustrates an exemplary hybrid Look-Up Table (LUT) based on a memory polynomial architecture for the S-DPD actuator of FIG. 1.

There are several LUT based approaches that can be possible. One option is to use a traditional LUT both in both the DPD adaptor 14 and the S-DPD actuators 104-1 through 104-B. This technique is well known. However, this technique is cumbersome when there are more than two frequency bands (i.e., when B>2), especially in the S-DPD actuators 104-1 through 104-B because of the excessive amount of memory required for storing multi-dimensional LUTs. Here, a hybrid LUT approach is considered, which is best suitable for the multiband case. The hybrid LUT architecture for the S-DPD actuator 104-$l$ is illustrated in FIG. 2. As can be seen from FIG. 2, Equation (1) is precomputed at various points of the complete range of input signals and the results are stored in the dynamic memory of the hardware; hence, the S-DPD actuator 104-$l$ requires a lower number of computations on the fly.

As shown in FIG. 2, there are M+1 hybrid LUTs for the S-DPD actuator 104-$l$, each considering B-inputs that are $\{|x_1|, |x_2|, \ldots, |x_B|\}$ and assuming the range of $|x_l|$ is divided into K parts. The division can be done taking statistical distribution of $|x_l|$ into consideration, like using usual companding methods such as, e.g., A-law or Mu-law used to compress a large dynamic range to more practical limits, or can be done uniformly in which case the size of each interval would be $$\frac{\max(|x_l|) - \min(|x_l|)}{K-1}.$$

Figure 3:
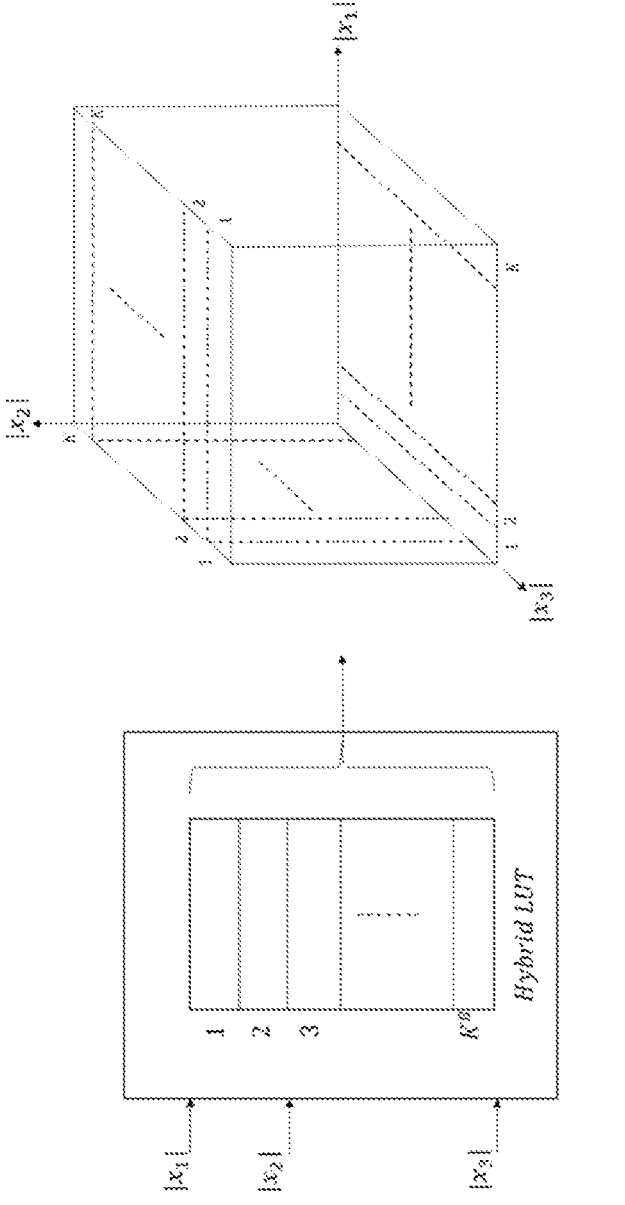
FIG. 3 illustrates an example of the hybrid LUT architecture of FIG. 2 in which there is a single hybrid LUT for a triple band case without memory taps (i.e., M=0)

The size of each hybrid LUT is $K^B$, and there are M+1 hybrid LUTs corresponding to the memory taps for each l-th band. FIG. 3 illustrates an example of the hybrid LUT architecture of FIG. 2 in which there is a single hybrid LUT for a triple band case without memory taps (i.e., M=0).

Figure 4A:
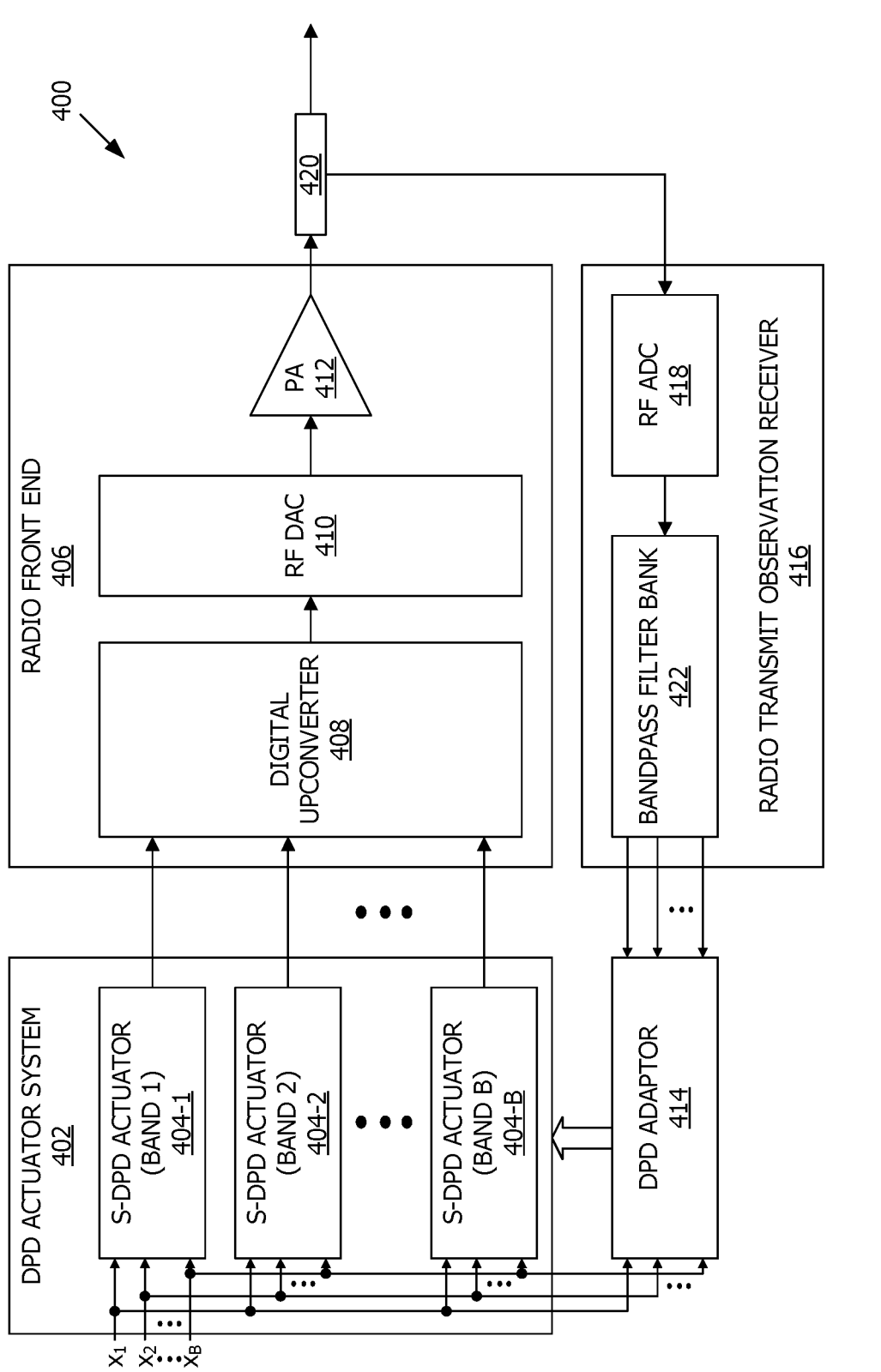
FIGS. 4A and 4B illustrate an example of a radio node that includes a DPD actuator system that uses a S-DPD architecture with reduced dimensionality hybrid LUTs in accordance with embodiments of the present disclosure.
Figure 4B:
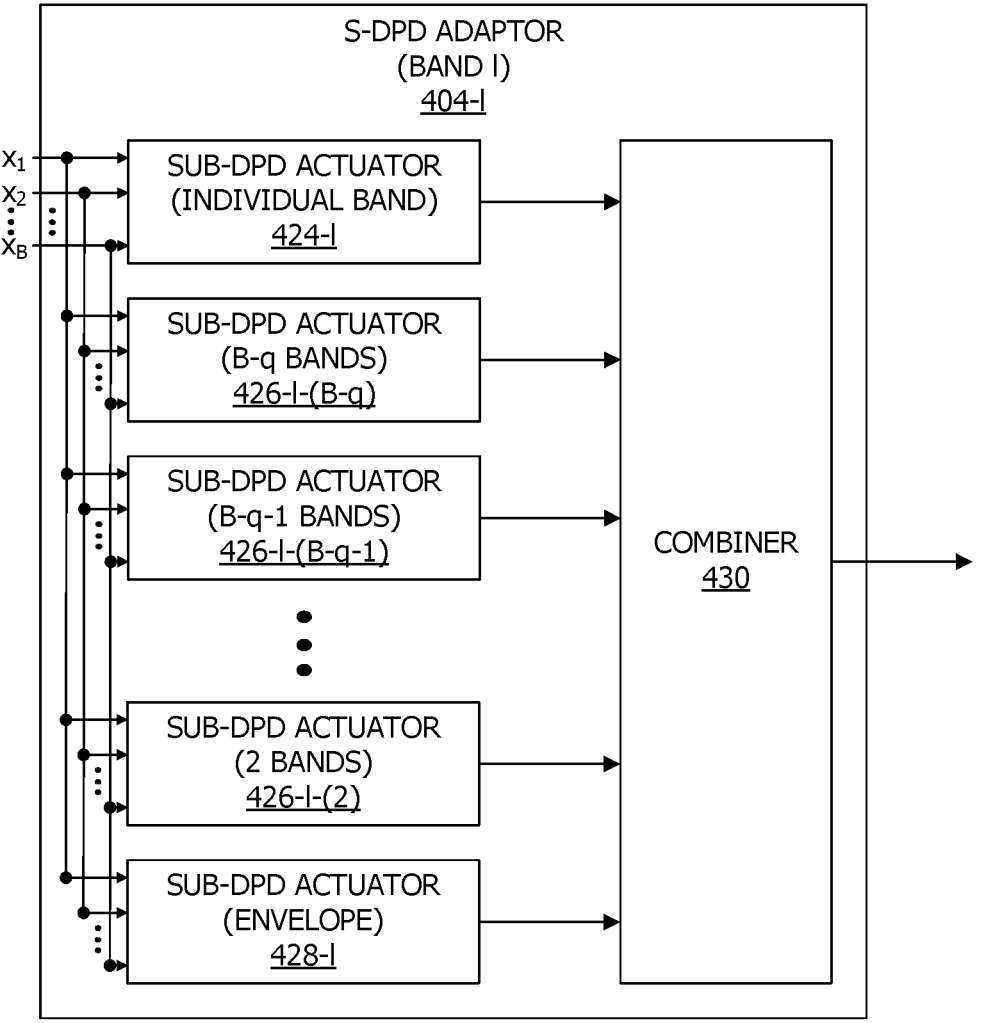

As can be seen from FIGS. 2 and 3, when using the hybrid LUT architecture, the memory requirements of the hybrid LUTs used by the S-DPD 104-$l$ becomes large as the number of frequency bands increases beyond 2. Systems and methods are disclosed herein that enable S-DPD using reduced dimensionality hybrid LUTs. In this regard, FIGS. 4A and 4B illustrate an example of a radio node 400 that includes a DPD actuator system 402 that uses a S-DPD architecture with reduced dimensionality hybrid LUTs in accordance with embodiments of the present disclosure.

As illustrated, the DPD system 402 includes multiple S-DPD actuators 404-1 through 404-B for B respective frequency bands ($b_1, \ldots, b_B$), where B is greater than or equal to 2 but preferably greater than 2. As discussed below in detail, each S-DPD actuator 404-$l$ (for the l-th frequency band) receives input signals ($x_1, \ldots, x_B$) (i.e., complex baseband input signals) for the B frequency bands (or at least a subset of the input signals) and generates a predistorted signal for the l-th frequency band based on the received input signals ($x_1, \ldots, x_B$) and a S-DPD actuator mechanism that utilizes reduced dimensionality hybrid LUTs. In this example, the predistorted signals for the B frequency bands are processed by a radio unit 406 of the radio unit 400 to provide a RF signal for transmission. Specifically, in this example, the predistorted signals for the B frequency bands a digitally upconverted by a digital upconverter 408, converted to analog by an RF DAC 410, and amplified by a PA 412.

In this example, the S-DPD actuators 404-1 through 404-B, and more specifically the reduced-dimensionality LUTs utilized by the S-DPD actuators 404-1 through 404-B, are trained by a DPD adaptor 414 based on the input signals ($x_1, \ldots, x_B$) and feedback signals for the B frequency bands received via a TOR 416. In this example, the TOR 416 includes a RF ADC 418 coupled to an output of the PA 412 via a coupler 420 and a bandpass filter bank 422 that filters the output of the RF ADC 418 to provide the feedback signals (i.e., complex baseband feedback signals) for the B frequency bands. Note that both the radio front end 406 and the TOR 416 may include additional or alternative component that are not illustrated in FIG. 4, as will be appreciated by those of ordinary skill in the art.

The operation of the S-DPD actuators 404-1 through 404-B is described below in terms of a memory polynomial (MP); however, one can easily extend the formulation for different variants of Volterra series such as a Generalized Memory Polynomial (GMP). Let us use $x_l(n)$ to represent input signals (i.e., input samples), where $l \in (1, B)$ represents the frequency band index. The output signal (i.e., output samples) from the l-th S-DPD 404-$l$ is denoted by $z_l(n)$. Note that n refers to a time-index. The maximum non-linear order of the S-DPD 404-$l$ is denoted by P. Memory taps are denoted by the set $Q = \{Q_0, Q_1, Q_2, \ldots Q_M\}$ with $Q_0=0$. The cardinality of $Q$ is M+1. The output from the S-DPD actuator 404-$l$ can be written as in Equation (1). However, as discussed below, the S-DPD actuator 404-$l$ decomposes the B-dimensional LUT problem into the summation of multiple lower-dimensional LUT problems.

In one embodiment, the S-DPD actuators 404-1 through 404-B perform digital predistortion based on a S-DPD scheme that uses B−q dimensional hybrid LUTs. This S-DPD scheme is also referred to herein as B−q dimensional S-DPD. The B−q dimensional S-DPD reduces the size of the hybrid LUTs from B-dimensions to B−q dimensions, where $q = \{1, 2, \ldots, B-2\}$. In this regard, FIG. 4B illustrates one embodiment of the l-th S-DPD actuator 404-$l$. Unlike in traditional S-DPD, the S-DPD actuator 404-$l$ includes several low-dimensional DPD actuators, which are referred to herein as "sub-DPD actuators". In other words, the conventional B-dimensional hybrid LUT problem is decomposed into the summation of multiple lower-dimensional hybrid LUT problems. These lower-dimensional hybrid LUT problems include, as described below, one or more B−q dimensional hybrid LUT problems. One advantage of this approach as compared to the tensor product approach described in the Quindroit Paper is that the predistorted output signals from the sub-DPDs are added, instead of multiplied. As such, the proposed S-DPD architecture significantly reduces the computational cost in the S-DPD actuator 404-$l$.

As illustrated in FIG. 4B, the S-DPD actuator 404-$l$ (i.e., the S-DPD actuator for the l-th frequency band) includes a sub-DPD actuator 424-$l$ that takes into account a single frequency band at a time. The S-DPD actuator 404-$l$ also includes multiple sub-DPD actuators for different numbers of two or more frequency bands, which are denoted generally as sub-DPD actuators 426-$l$-(B−r), where the values of r are the values in the set $\{q, q+1, \ldots, B-2\}$. Thus, in this example, the sub-DPD actuators 426-$l$-(B−r) include a sub-DPD actuator 426-$l$-(B−q) for B−q frequency bands, a sub-DPD actuator 426-$l$-(B−q−1) for B−q−1 frequency bands, . . . , and sub-DPD actuator 426-$l$-(2). In addition, the S-DPD actuator 404-$l$ includes a sub-DPD actuator 428-$l$ for an envelope of input signals. Note that the sub-DPD actuators 424-$l$ and 428-$l$ are optional. Also note that not all of the sub-DPD actuators 426-$l$-(B−r) are required. The S-DPD actuator 404-$l$ includes the sub-DPD actuator(s) 426-$l$-(B−r) for at least one, at least two, or all values of r from the set $\{q, q+1, \ldots, B-2\}$, where q is a value in the range of and including 1 to B−2. The details of each of the sub-DPD actuators 424-$l$, 426-$l$-(B−r), and 428-$l$ are described. The predistorted signals output by the sub-DPD actuators 424-$l$, 426-$l$-(B−r), and 428-$l$ are combined (e.g., summed) by combiner 430 to provide a combined predistorted output signal output by the S-DPD 404-$l$.

The sub-DPD actuator 424-*l* only takes into account one frequency band at a time. The predistorted output signal $$f_l^{(i)}(n)$$

output from the sub-DPD actuator 424-*l* can be written as follows:

$$f_l^{(i)}(n) = \tag{2}$$
$$x_l(n) + \sum_{m=0}^{M} x_l(n - Q_m)\left(\alpha_{l,m}^{(i)} + \sum_{b=1}^{B}\sum_{p=1}^{P-1}\alpha_{l,m,p,b}^{(i)}|x_b(n - Q_m)|^p\right)$$

Figure 5:
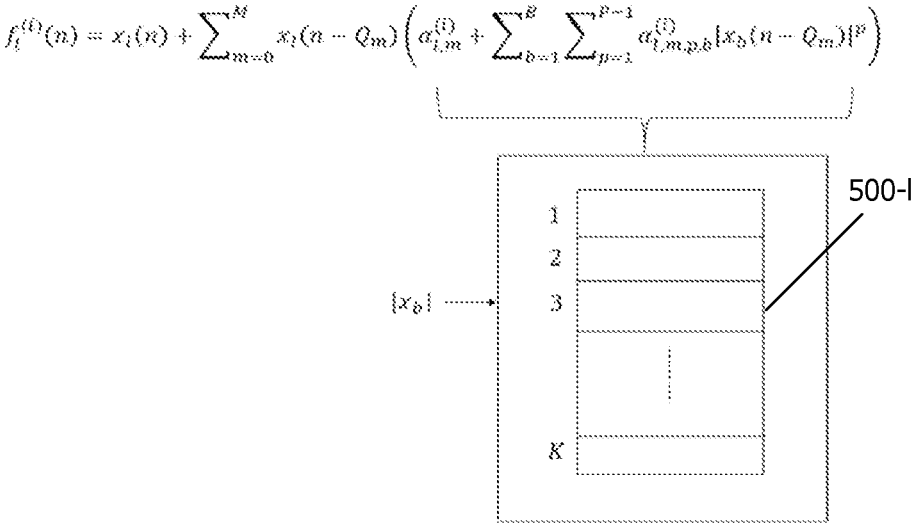
FIG. 5 illustrates an example of a hybrid LUT for the individual band sub-DPD actuator of FIG. 4B for one memory tap.

As can be seen from Equation (2), the sub-DPD actuator 424-*l* only considers one frequency band input $x_b(n-Q_m)$ when constructing the basis function along with the input $x_l(n)$ from *l*-th frequency band. A hybrid LUT 500-*l* for the sub-DPD actuator 424-*l* for one memory tap is shown in FIG. 5. As clear from FIG. 5, hybrid LUT 500-*l* in the sub-DPD actuator 424-*l* is a one-dimensional LUT (i.e., it works on one dimension, i.e., one input signal). For the *l*-th frequency band, there are (M+1) hybrid LUTs 500-*l*, one for each of the memory taps.

The sub-DPD actuator 428-*l* works on the worst-case envelope i.e., the summation of the magnitudes of the input signals from all B frequency bands. The predistorted signal $$f_l^{(e)}(n)$$

output from the sub-DPD actuator 428-*l* can be expressed as follows:

$$f_l^{(e)}(n) = \sum_{m=0}^{M} x_l(n - Q_m)\sum_{p=1}^{P-1}\alpha_{l,m,p}^{(e)}\left(\sum_{b=1}^{B}|x_b(n - Q_m)|\right)^p \tag{3}$$

Figure 6:
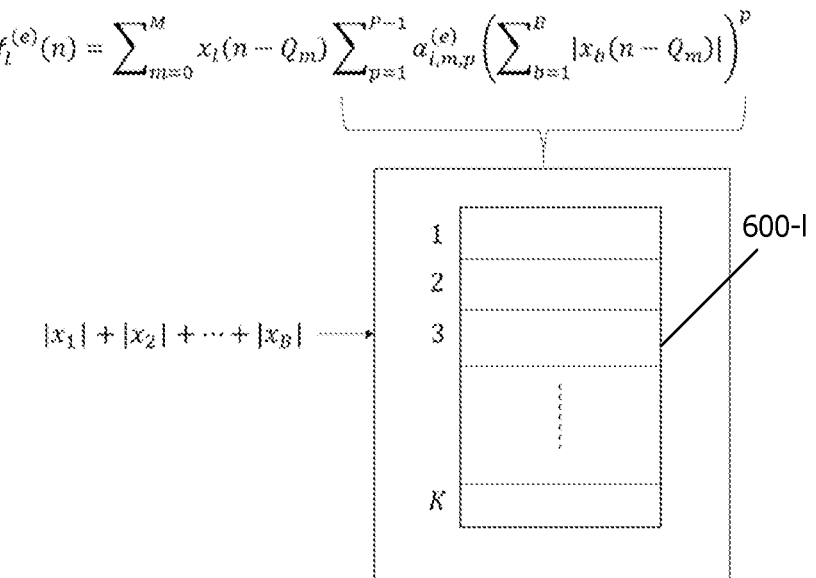
FIG. 6 illustrates an example of a hybrid LUT for the envelope sub-DPD actuator of FIG. 4B for one memory tap.

FIG. 6 illustrates a hybrid LUT 600-*l* for the sub-DPD actuator 428-*l*. While not illustrated, note that, for the *l*-th frequency band, there are M+1 hybrid LUTs 600-*l*, one for each memory tap. As can be seen in FIG. 6, the hybrid LUT 600-*l* for the sub-DPD actuator 428-*l* is a one-dimensional LUT. Note that the resolution of the LUT 600-*l* is shown the same as before, i.e. K, however, the resolution of the LUT 600-*l* can be a value other than K.

For the sub-DPD actuators 426-*l*-(B−r), there are r={q, q+1, . . . , B−2} sub-DPD actuators 426-*l*-(B−r) on one example embodiment, one for each value of r. Let us use $\mathcal{B}$ ={1, 2, . . . B} to denote the set of all band indices. The sub-DPD actuator 426-*l*-(B−r) uses a subset of frequency bands to construct the basis functions for the predistortion.

$$\mathcal{A}_r = \left\{i_1, i_2, \dots i_k, \dots, i_{\binom{B}{B-r}}\right\}$$

denotes the superset containing sets $i_k$ of all the combinations of B−r frequency bands from the B frequency bangs, where $$\binom{B}{B-r}$$

is a binomial coefficient (i.e., denotes the number of combinations of B−r frequency bands that can be created from the set of B frequency bands). In other words, a set $i_k$ is drawn from $\mathcal{B}$ choosing B−r elements or $i_k \subset \mathcal{B}$. For instance, when there are three bands, B=3, q=1 one can only have r={1}. In this case, B−r=2 then $\mathcal{A}_1$={{1, 2}, {1, 3}, {2, 3}}. When B=4, q=1, one can have r={1,2}. So, there are two possibilities i.e., i) B−r=3, $\mathcal{A}_1$={{1, 2, 3}, {1, 2, 4}, {1, 3, 4}, {2, 3, 4}}; ii) B−r=2, $\mathcal{A}_2$={{1, 2}{1, 3}, {1, 4}, {2, 3}, {2, 4}, {3, 4}}. Similarly, when B=4, q=2, one can have r={2} which leads to only one possibility i.e., B−r=2, $\mathcal{A}_1$={{1, 2}{1, 3}, {1, 4}, {2, 3}, {2, 4}, {3, 4}}. Using the defined set notation, the output from the sub-DPD actuator 426-*l*-(B−r) for a particular value of r can be expressed as follows:

$$f_l^{(B-r)}(n) = \sum_{m=0}^{M} x_l(n - \tag{4}$$
$$Q_m)\sum_{p_1=1}^{P-1}\sum_{p_2=1}^{p_1}\cdots\sum_{p_{B-r}=1}^{p_{B-r-1}}\sum_{k=1}^{\binom{B}{B-r}}\alpha_{l,m,k,p_1,p_2,\dots,p_{B-r}}^{(B-r)}\prod_{b\in i_k}|x_b(n - Q_m)|^{(p_b - p_{b+1})}$$

Figure 7:
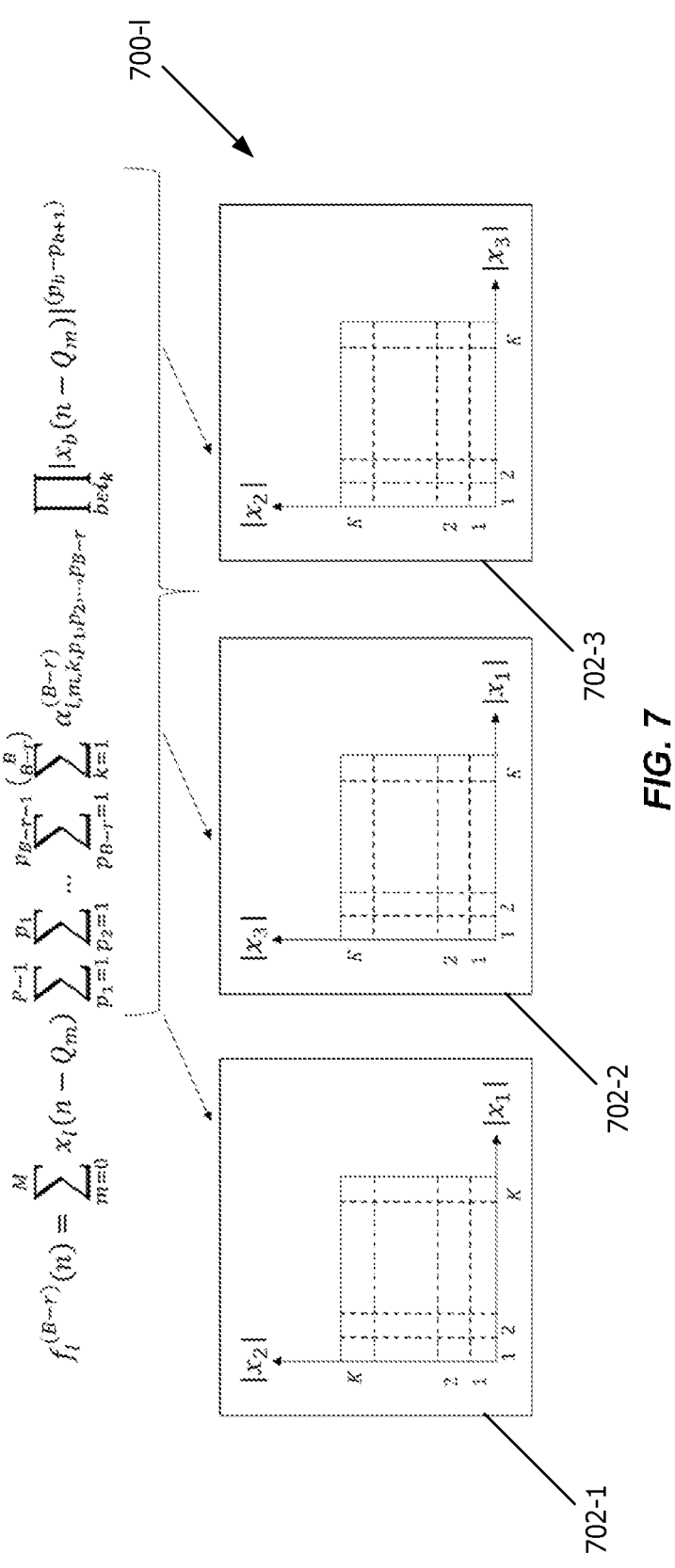
FIG. 7 illustrates an example of a hybrid LUT for the (B–r) frequency band combination sub-DPD actuator of FIG. 4B for one memory tap for the (B–r) dimensional S-DPD scheme described herein.

A hybrid LUT system 700-*l* for the sub-DPD actuator 426-*l*-(B−r) for a particular value of r for an example case of triple band (i.e., B=3, q+1, and r=1) is illustrated in FIG. 7. In this case, for the *l*-th frequency band, there are $$\binom{B}{B-r}$$

hybrid LUTs 702-*l*-1 to $$702\text{-}l\text{-}\binom{B}{B-r}$$

for the sub-DPD actuator 426-*l*-(B−r), for each memory tap. Thus, using the hybrid LUTs 702-*l*-1 to $$702\text{-}l\text{-}\binom{B}{B-r}$$

for the sub-DPD actuator 426-*l*-(B−r) for M+1 memory taps, the output sample of the sub-DPD actuator 426-*l*-(B−r) can be expressed mathematically as:

$$f_l^{(B-r)}(n) = \sum_{m=0}^{M} x_l(n - Q_m)(LUT1 + LUT2 + LUT3),$$

where LUT1 is the output of the hybrid LUT 702-*l*-1 for first frequency band combination, LUT2 is the output of the hybrid LUT 702-*l*-2 for the second frequency band combination, and LUT3 is the output of the hybrid LUT 702-*l*-3 for the third frequency band combination. As shown in FIG. 7, the sub-DPD actuator 426-*l*-(B−r) takes a maximum of B−q dimension input signals (i.e., each hybrid LUT 702-1 is a B−q dimensional LUT). This proposed architecture is referred to herein as (B−q) dimensional S-DPD.

The description above relates to a (B−q) dimensional S-DPD. Now, an embodiment referred to herein as a one-dimensional S-DPD will be described. For the one-dimensional S-DPD, each of the sub-DPD actuators 426-*l*-(B−r) considers one-dimension input signals. More specifically, for one-dimensional S-DPD, the sub-DPD actuators 424-*l* and 428-*l* are the same as described above. However, the sub-DPD actuators 426-*l*-(B−r) operate differently as compared to the (B−r) dimensional S-DPD described above.

For one-dimensional S-DPD, to capture the dependency of different frequency bands in predistorted signal output by the S-DPD actuator 404-1 output, the sub-DPD actuators 426-*l*-(B−r) operate based on the summation of the magnitudes of the input signals coming from different frequency bands instead of multiplications as in the proposed B−q dimensional S-DPD described above. Thus, for one-dimensional S-DPD, the predistorted signal $$f_l^{(B-r,e)}(n)$$

output by the sub-DPD actuator 426-*l*-(B−r) for a given value of r can be expressed as follows:

$$f_l^{(B-r,e)}(n) = \sum_{m=0}^{M} x_l(n - Q_m) \sum_{p=1}^{P-1} \sum_{k=1}^{\binom{B}{B-r}} \alpha_{l,m,k,p}^{(B-r,e)} \left( \sum_{b \in i_k} |x_b(n - Q_m)| \right)^p \tag{5}$$

Figure 8:
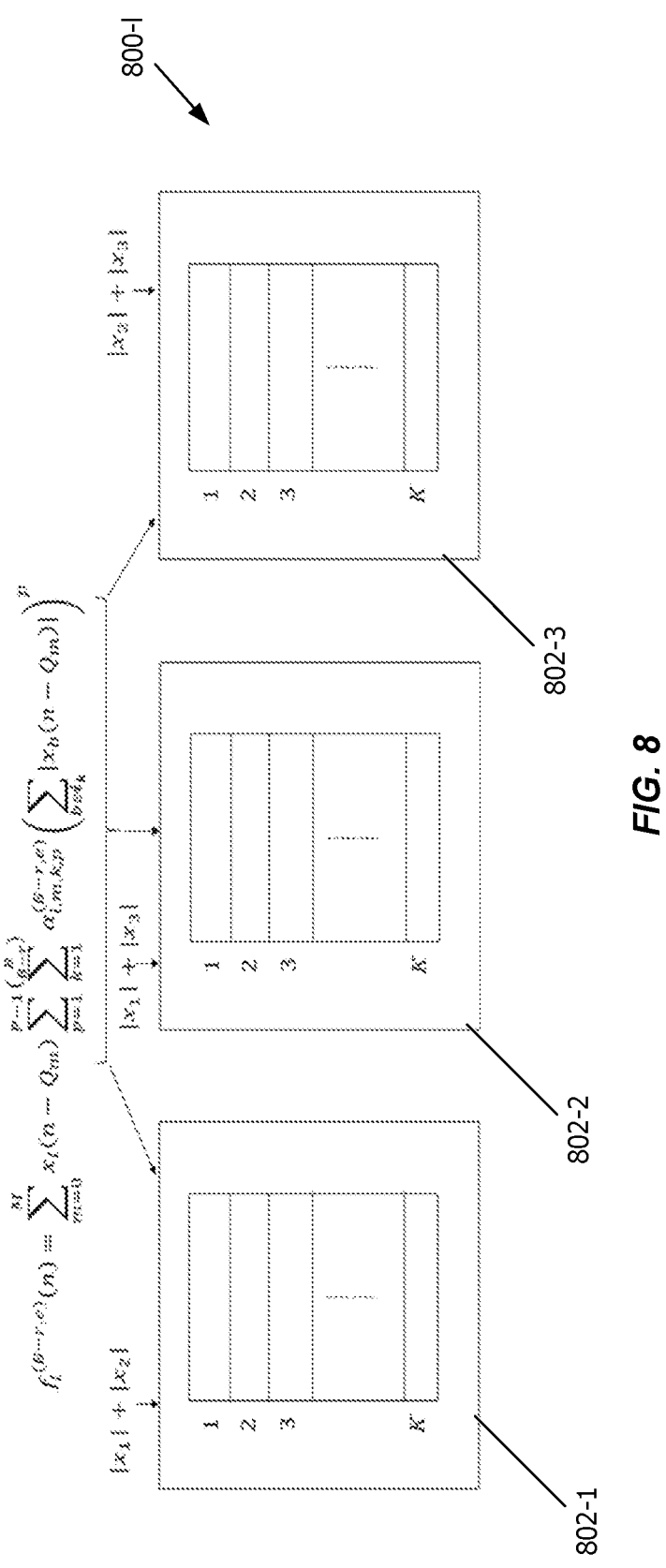
FIG. 8 illustrates an example of a hybrid LUT for the (B–r) frequency band combination sub-DPD actuator of FIG. 4B for the one-dimensional S-DPD scheme described herein.

Here, the definition of $\mathcal{A}_r$ and $i_k$ remains the same as described above. A hybrid LUT system 800-*l* for the sub-DPD actuator 426-*l*-(B−r) for a given value of r for an example case of triple band (i.e., B=3, q=1, r=1) is illustrated in FIG. 8. In this case, for the m-th memory tap, there are $$\binom{B}{B-r}$$

hybrid LUTs 802-*l*-1 to $$802 - l - \binom{B}{B-r}$$

for the sub-DPD actuator 426-*l*-(B−r). Thus, using the hybrid LUTs 800-*l*-1 to $$802 - l - \binom{B}{B-r}$$

for the sub-DPD actuator 426-*l*-(B−r) for M+1 memory taps, the output sample of the sub-DPD actuator 426-*l*-(B−r) can be expressed mathematically as:

$$f_l^{(B-r,e)}(n) = \sum_{m=0}^{M} x_l(n - Q_m)(LUT1 + LUT2 + LUT3)$$

where LUT1 is the output of the hybrid LUT 802-*l*-1 for first frequency band combination, LUT2 is the output of the hybrid LUT 802-*l*-2 for the second frequency band combination, and LUT3 is the output of the hybrid LUT 802-*l*-3 for the third frequency band combination. As shown in FIG. 8, the sub-DPD actuator 426-*l*-(B−r) takes a maximum of one dimension input signals. In other words, each of the hybrid LUTs 802-*l* is a one-dimensional LUT that is indexed by a sum of the input signals for the respective combination of B−r frequency bands.

Figure 9:
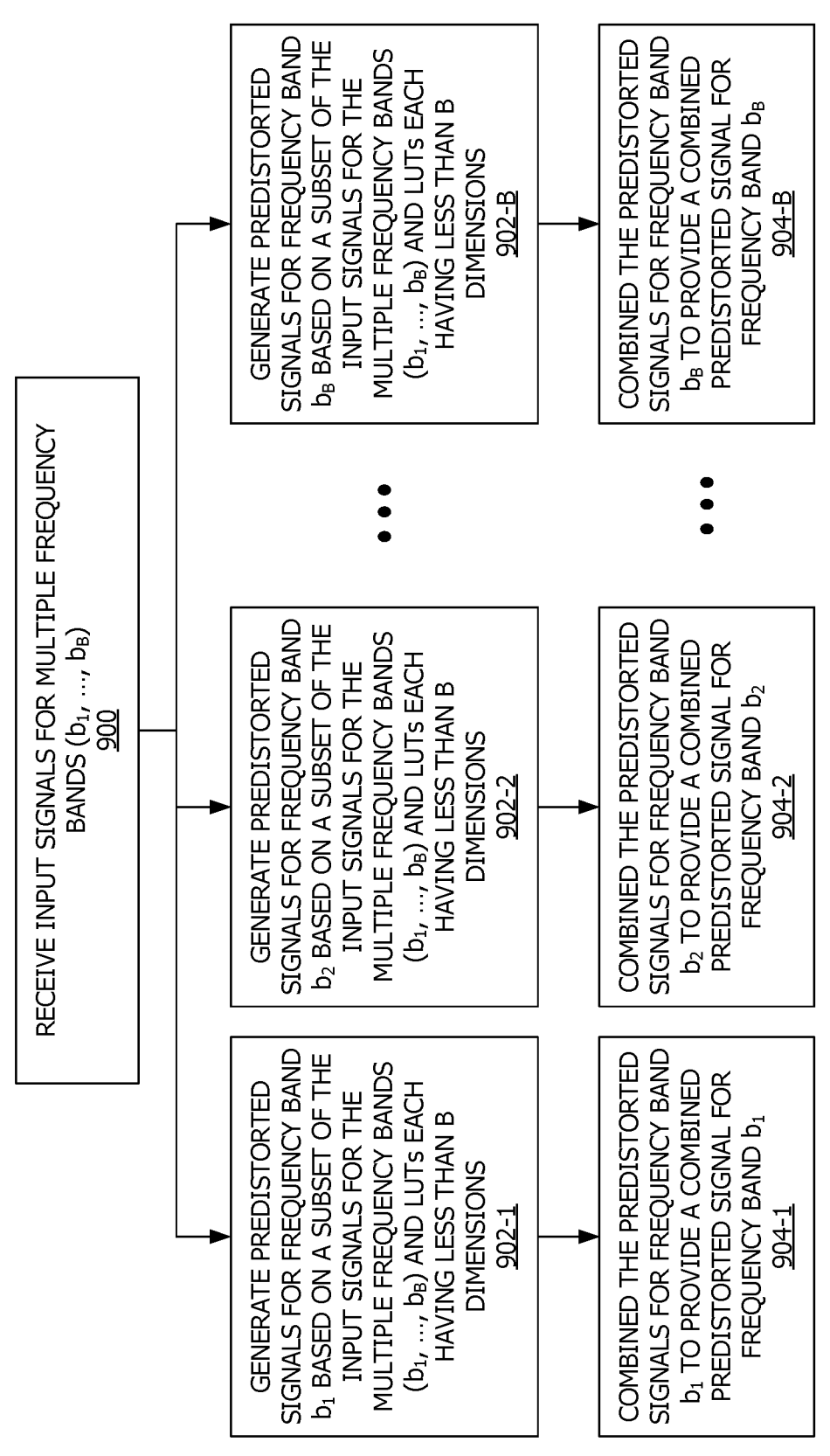
FIG. 9 is a flow chart that illustrates the operation of the DPD actuator system using one of the S-DPD schemes described herein in accordance with embodiments of the present disclosure.

FIG. 9 is a flow chart that illustrates the operation of the DPD actuator system 402 in accordance with embodiments of the present disclosure. As illustrated, the DPD actuator system 402 receives B input signals ($x_1, \ldots, x_B$) for B frequency bands ($b_1, \ldots, b_B$), respectively (step 900). For each frequency band ($b_l$) of the B frequency bands ($b_1, \ldots, b_B$), the S-DPD 404-*l* for the frequency band ($b_l$) generates multiple predistorted signals for the frequency band ($b_l$) based on the input signals ($x_1, \ldots, x_B$) and a multiple LUTs, each having less than B dimensions (step 902-*l*) and combines those predistorted signals for the frequency band ($b_l$) to provide a combined predistorted signal for the frequency band ($b_l$) (step 904-*l*).

FIG. 10 is a flow chart that illustrates details of step 902-*l* for the l-th frequency band ($b_l$) in accordance with the (B−q) dimensional S-DPD scheme described above. Optional steps are represented by dashed lines/boxes. Note that while the steps of FIG. 10 are shown as being performed in sequential order, some or all of the steps may be performed in parallel. As illustrated, the S-DPD actuator 404-*l*, and more specifically the sub-DPD actuator 424-*l*, for the frequency band ($b_l$) may generate a predistorted signal for the frequency band ($b_l$) in a manner that takes into consideration only a single frequency band at a time (step 1000). Here, the details described above for the sub-DPD actuator 424-*l* are applicable.

For each value of r from at least a subset of a set of values $\{q, q+1, \ldots, B-2\}$, the S-DPD actuator 404-*l*, and more specifically the sub-DPD actuator(s) 426-*l*-(B−r) for the value of r, for the frequency band ($b_l$) generates a predistorted signal based on: (a) input signals for a set of frequency band combinations that consists of at least one combination, at least two combinations, or all combinations of B−r frequency bands from among the plurality of frequency bands ($b_1, \ldots, b_B$) and (b) a set of LUTs that comprises a B−r dimension LUT for each frequency band combination in the set of frequency band combinations (step 1002). In one embodiment, the at least a subset of the set of values $\{q, q+1, \ldots, B-2\}$ is a single value from the set of values $\{q, q+1, \ldots, B-2\}$. In another embodiment, the at least a subset of the set of values $\{q, q+1, \ldots, B-2\}$ is at least two values from the set of values $\{q, q+1, \ldots, B-2\}$. In another embodiment, the at least a subset of the set of values $\{q, q+1, \ldots, B-2\}$ is all of the set of values $\{q, q+1, \ldots, B-2\}$. Note that number of values of r and/or the value(s) of r used for each of the B frequency bands may be the same or different. Note that the details provided above regarding the sub-DPD actuator(s) 426-*l*-(B−r) are equally applicable here.

The S-DPD actuator 404-*l*, and more specifically the sub-DPD actuator 428-*l*, for the frequency band ($b_l$) may generate a predistorted signal for the frequency band ($b_l$) based on a worst-case envelope, i.e., the summation of magnitudes of the input signals from all B frequency bands (step 1004). Here, the details described above for the sub-DPD actuator 426-*l* are applicable. As discussed above, the predistorted signals output from steps 1000, 1002, and 1004 for the l-th frequency band ($b_l$) are combined (in step 904-*l*) to provide the combined predistorted output signal for the l-th frequency band ($b_l$).

FIG. 11 is a flow chart that illustrates details of step 902-$l$ for the l-th frequency band (b$_l$) in accordance with the one-dimensional S-DPD scheme described above. Optional steps are represented by dashed lines/boxes. Note that while the steps of FIG. 11 are shown as being performed in sequential order, some or all of the steps may be performed in parallel. As illustrated, the S-DPD actuator 404-$l$, and more specifically the sub-DPD actuator 424-$l$, for the frequency band (b$_l$) may generate a predistorted signal for the frequency band (b$_l$) in a manner that takes into consideration only a single frequency band at a time (step 1100). Here, the details described above for the sub-DPD actuator 424-$l$ are applicable.

For each value of r from at least a subset of a set of values {q, q+1, . . . , B−2}, the S-DPD actuator 404-$l$, and more specifically the sub-DPD actuator(s) 426-$l$-(B−r) for the value of r, for the frequency band (b$_l$) generates a predistorted signal based on: (a) a sum of magnitudes of input signals for a set of frequency band combinations that consists of at least one combination, at least two combinations, or all combinations of B−r frequency bands from among the plurality of frequency bands (b$_1$, . . . , b$_B$) and (b) a set of LUTs that comprises a single-dimension LUT for each frequency band combination in the set of frequency band combinations (step 1102). In one embodiment, the at least a subset of the set of values {q, q+1, . . . , B−2} is a single value from the set of values {q, q+1, . . . , B−2}. In another embodiment, the at least a subset of the set of values {q, q+1, . . . , B−2} is at least two values from the set of values {q, q+1, . . . , B−2}. In another embodiment, the at least a subset of the set of values {q, q+1, . . . , B−2} is all of the set of values {q, q+1, . . . , B−2}. Note that the number of values of r and/or the value(s) of r used for each of the B frequency bands may be the same or different. Note that the details provided above regarding the sub-DPD actuator(s) 426-$l$-(B−r) are equally applicable here.

The S-DPD actuator 404-$l$, and more specifically the sub-DPD actuator 428-$l$, for the frequency band (b$_l$) may generate a predistorted signal for the frequency band (b$_l$) based on a worst-case envelope, i.e., the summation of magnitudes of the input signals from all B frequency bands (step 1104). Here, the details described above for the sub-DPD actuator 426-$l$ are applicable. As discussed above, the predistorted signals output from steps 1000, 1002, and 1004 for the l-th frequency band (b$_l$) are combined (in step 904-$l$) to provide the combined predistorted output signal for the l-th frequency band (b$_l$).

The proposed S-DPD architectures disclosed herein provide significant advantages as compared to the existing full-dimensional S-DPD architecture. Here, it is assumed that a hybrid LUT can support K resolution in the hybrid LUT. There are B bands where K>B. The full-dimensional S-DPD, which takes B inputs, requires K$^B$ memory in the hybrid LUT. The proposed B−q dimension S-DPD requires $$K + \sum_{b=1}^{B-q} K^b \binom{B}{b}$$

memory in the hybrid LUT. On the other hand, the proposed one-dimension S-DPD requires only $$K \sum_{b=1}^{B} \binom{B}{b}$$

memory in the hybrid LUT. The above values of memory requirements can be further written in compact form as in Table 1 to compare among themselves.

TABLE 1

| Memory Requirements for B bands and K-bin LUT Structure | | | |
|---|---|---|---|
| | Full B-dimensional S-DPD | Proposed B − q dimension S-DPD | Proposed 1 dimension S-DPD |
| Hybrid LUT Memory Requirements | $K^B$ | $K + \sum_{b=1}^{B-q} K^b \binom{B}{b}$ | $K \sum_{b=1}^{B} \binom{B}{b}$ |

A simple use case can be made to quantify the implementation advantages of the proposed architectures. Suppose there are three bands B=3, q=1 and hybrid LUT can support 12 resolution that is K=12. The full-dimensional S-DPD requires 12$^3$=1728 memory size of S-DPD. For B−q dimension S-DPD, the hybrid LUT requires $$12 + 12^1 \binom{3}{1} + 12^2 \binom{3}{2} = 480$$

memory size S-DPD. On the other hand, one-dimension S-DPD requires only $$12 \binom{3}{1} + 12 \binom{3}{2} + 12 \binom{3}{3} = 84$$

memory size S-DPD in the hybrid LUT. As a result, keeping same resolution of the LUT, i.e. value of K, our proposed B−q dimension S-DPD requires 28% of the memory required for traditional S-DPD using three-dimensional hybrid LUT, and the proposed one-dimension S-DPD requires just 5% of the memory required for traditional S-DPD using three-dimensional hybrid LUT.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include Digital Signal Processors (DSPs), special-purpose digital logic, and the like. The processing circuitry may be configured to execute program code stored in memory, which may include one or several types of memory such as Read Only Memory (ROM), Random Access Memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

While processes in the figures may show a particular order of operations performed by certain embodiments of the present disclosure, it should be understood that such order is exemplary (e.g., alternative embodiments may perform the operations in a different order, combine certain operations, overlap certain operations, etc.).

Those skilled in the art will recognize improvements and modifications to the embodiments of the present disclosure. All such improvements and modifications are considered within the scope of the concepts disclosed herein.

The invention claimed is:

1. A method of operation of a digital predistortion actuator system for a radio node for a wireless network, the method comprising:

receiving a plurality of input signals $(x_1, \ldots, x_B)$ for a plurality of frequency bands $(b_1, \ldots, b_B)$, respectively;

for each frequency band $(b_1)$ of the plurality of frequency bands $(b_1, \ldots, b_B)$:

generating a plurality of predistorted signals for the frequency band $(b_1)$ based on the plurality of input signals $(x_1, \ldots, x_B)$ and a plurality of Look-Up Tables, LUTs, each having less than B dimensions; and combining the plurality of predistorted signals for the frequency band $(b_1)$ to provide a combined predistorted signal for the frequency band $(b_1)$, wherein for each frequency band $(b_1)$ of the plurality of frequency bands $(b_1, \ldots, b_B)$, generating the plurality of predistorted signals for the frequency band $(b_1)$ comprises:

for each value of r from at least a subset of a set of values $\{q, q+1, \ldots, B-2\}$ where $1 \le q \le B-2$:

O generating a predistorted input signal for the frequency band $(b_1)$ for the value of r, based on:

input signals for a set of frequency band combinations that consists of at least one combination of B-r frequency bands from among the plurality of frequency bands $(b_1, \ldots, b_B)$; and a set of LUTs that comprises a B-r dimension LUT for each frequency band combination in the set of frequency band combinations.

2. The method of claim 1 wherein the set of frequency band combinations consists of at least two combinations of B-r frequency bands from among the plurality of frequency bands $(b_1, \ldots, b_B)$.

3. The method of claim 1 wherein the set of frequency band combinations consists of all combinations of B-r frequency bands from among the plurality of frequency bands $(b_1, \ldots, b_B)$.

4. The method of claim 1 wherein, for each frequency band $(b_1)$ of the plurality of frequency bands $(b_1, \ldots, b_B)$, the at least a subset of the set of values $\{q, q+1, \ldots, B-2\}$ consists of at least one value from the set of values $\{q, q+1, \ldots, B-2\}$.

5. The method of claim 1 wherein, for at least one frequency band $(b_1)$ of the plurality of frequency bands $(b_1, \ldots, b_B)$, the at least a subset of the set of values $\{q, q+1, \ldots, B-2\}$ consists of at least two values from the set of values $\{q, q+1, \ldots, B-2\}$.

6. The method of claim 1 wherein, for at least one frequency band $(b_1)$ of the plurality of frequency bands $(b_1, \ldots, b_B)$, the at least a subset of the set of values $\{q, q+1, \ldots, B-2\}$ consists of all values from the set of values $\{q, q+1, \ldots, B-2\}$.

7. The method of claim 1 wherein the at least a subset of the set of values $\{q, q+1, \ldots, B-2\}$ is different for at least two of the plurality of frequency bands $(b_1, \ldots, b_B)$.

8. The method of claim 1 wherein the at least a subset of the set of values $\{q, q+1, \ldots, B-2\}$ is the same for all of the plurality of frequency bands $(b_1, \ldots, b_B)$.

9. The method of claim 1 wherein, for at least one frequency band $(b_1)$ of the plurality of frequency bands $(b_1, \ldots, b_B)$, generating the plurality of predistorted signals for the frequency band $(b_1)$ further comprises generating a predistorted signal for the frequency band $(b_1)$ in a manner that takes into account only a single frequency band at a time.

10. The method of claim 1 wherein, for at least one frequency band $(b_1)$ of the plurality of frequency bands $(b_1, \ldots, b_B)$, generating the plurality of predistorted signals for the frequency band $(b_1)$ further comprises generating a predistorted signal for the frequency band $(b_1)$ based on a summation of magnitudes of the plurality of input signals $(x_1, \ldots, x_B)$ for the plurality of frequency bands $(b_1, \ldots, b_B)$ and a single-dimension LUT for the frequency band $(b_1)$.

11. A method of operation of a digital predistortion actuator system for a radio node for a wireless network, the method comprising:

receiving a plurality of input signals $(x_1, \ldots, X_B)$ for a plurality of frequency bands $(b_1, \ldots, b_B)$, respectively;

for each frequency band $(b_1)$ of the plurality of frequency bands $(b_1, \ldots b_B)$;

generating a plurality of predistorted signals for the frequency band (bi) based on the plurality of input signals $(X_1, \ldots, X_B)$ and a plurality of Look-Up Tables, LUTs, each having less than B dimensions; and combining the plurality of predistorted signals for the frequency band $(b_1)$ to provide a combined predistorted signal for the frequency band $(b_1)$, wherein, for each frequency band (bi) of the plurality of frequency bands $(b_1, \ldots, b_B)$, generating the plurality of predistorted signals for the frequency band $(b_1)$ comprises:

for each value of r from at least a subset of a set of values $\{q, q+1, \ldots, B-2\}$ where $1 \le q \le B-2$:

generating a predistorted input signal for the frequency band $(b_1)$ for the value of r, based on:

a sum of magnitudes of input signals for a set of frequency band combinations that consists of at least one combination of B-r frequency bands from among the plurality of frequency bands $(b_1, \ldots, b_B)$; and a set of LUTs that comprises a single-dimension LUT for each frequency band combination in the set of frequency band combinations.

12. The method of claim 11 wherein the set of frequency band combinations consists of at least two combinations of B-r frequency bands from among the plurality of frequency bands $(b_1, \ldots, b_B)$.

13. The method of claim 11 wherein the set of frequency band combinations consists of all combinations of B-r frequency bands from among the plurality of frequency bands $(b_1, \ldots, b_B)$.

14. A digital predistortion actuator system for a radio node for a wireless network, the digital predistortion actuator system comprising:

a plurality of Separate Digital Predistortion, S-DPD, actuators for a plurality of frequency bands $(b_1, \ldots, b_B)$, respectively;

wherein each S-DPD actuator of the plurality of S-DPD actuators is configured to:

receive a plurality of input signals $(x_1, \ldots, x_B)$ for the plurality of frequency bands $(b_1, \ldots, b_B)$, respectively;

generate a plurality of predistorted signals for a frequency band $(b_1)$ of the plurality of frequency bands $(b_1, \ldots, b_B)$ based on the plurality of input signals $(x_1, \ldots, x_B)$ and a plurality of Look-Up Tables, LUTs, each having less than B dimensions; and combine the plurality of predistorted signals for the frequency band $(b_1)$ to provide a combined predistorted signal for the frequency band $(b_l)$, wherein each S-DPD actuator of the plurality of S-DPD comprises:

for each value of r from at least a subset of a set of values $\{q, q+1, \ldots B-2\}$ where $1 \le q \le B-2$:

a sub-DPD actuator configured to generate a predistorted input signal for the frequency band $(b_1)$ for the value of r, based on:

input signals for a set of frequency band combinations that consists of at least one combination of B-r frequency bands from among the plurality of frequency bands $(b_1, \ldots b_B)$; and a set of LUTs that comprises a B-r dimension LUT for each frequency band combination in the set of frequency band combinations; or a sum of magnitudes of input signals for a set of frequency band combinations that consists of at least one combination of B-r frequency bands from among the plurality of frequency bands $(b_1, \ldots b_B)$; and a set of LUTs that comprises a single-dimension LUT for each frequency band combination in the set of frequency band combinations.

15. The digital predistortion actuator system of claim 14 wherein the set of frequency band combinations consists of at least two combinations of B-r frequency bands from among the plurality of frequency bands $(b_1, \ldots, b_B)$.

16. The digital predistortion actuator system of claim 14 wherein the set of frequency band combinations consists of all combinations of B-r frequency bands from among the plurality of frequency bands $(b_1, \ldots, b_B)$.

\* \* \* \* \*